US012696573B2

(12) United States Patent
Chiang et al.

(10) Patent No.: US 12,696,573 B2
(45) Date of Patent: Jul. 28, 2026

(54) STRUCTURE AND FORMATION METHOD OF SEMICONDUCTOR DEVICE WITH PHOTODETECTOR

(71) Applicant: Taiwan Semiconductor Manufacturing Company, Ltd., Hsinchu (TW)

(72) Inventors: Chen-Hao Chiang, Taoyuan City (TW); Li-Weng Chang, New Taipei City (TW); Jiun-Yi Wu, Taoyuan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 483 days.

(21) Appl. No.: 18/309,420

(22) Filed: Apr. 28, 2023

(65) Prior Publication Data
US 2024/0363774 A1 Oct. 31, 2024

(51) Int. Cl.
| | |
|---|---|
| *H10F 77/12* | (2025.01) |
| *H10F 71/00* | (2025.01) |
| *H10F 77/14* | (2025.01) |
| *H10F 77/20* | (2025.01) |

(52) U.S. Cl.
CPC ........... *H10F 77/12* (2025.01); *H10F 71/121* (2025.01); *H10F 77/14* (2025.01); *H10F 77/206* (2025.01)

(58) Field of Classification Search
CPC ........ H10F 77/12; H10F 71/121; H10F 77/14; H10F 77/206; H10F 30/223; H10F 77/1226; H10F 77/147; H10F 77/306
See application file for complete search history.

(56) References Cited

U.S. PATENT DOCUMENTS

| | | | |
|---|---|---|---|
| 2021/0091239 A1* | 3/2021 | Chern | .................... H10F 30/223 |
| 2022/0131017 A1 | 4/2022 | Chiang et al. | |
| 2022/0326443 A1 | 10/2022 | Song et al. | |

FOREIGN PATENT DOCUMENTS

| | | | |
|---|---|---|---|
| CN | 110797431 | * | 2/2020 |
| CN | 114078887 | * | 2/2022 |
| WO | WO 2019/229532 A1 | | 12/2019 |
| WO | WO 2022/043513 A1 | | 3/2022 |

OTHER PUBLICATIONS

Taiwanese Office Action and Search Report for Taiwanese Application No. 112123622, dated Jan. 23, 2024.

* cited by examiner

*Primary Examiner* — Matthew L Reames
(74) *Attorney, Agent, or Firm* — Birch, Stewart, Kolasch & Birch, LLP

(57) ABSTRACT

A semiconductor device structure and a formation method are provided. The method includes forming a p-type doped region and an n-type doped region in a semiconductor substrate. The method also includes partially removing the semiconductor substrate to form a recess exposing portions of the p-type doped region and the n-type doped region. The method further includes epitaxially growing a buffer layer along sidewalls and a bottom of the recess. In addition, the method includes epitaxially growing a photo-sensing structure over the buffer layer. The photo-sensing structure contains germanium and tin.

20 Claims, 8 Drawing Sheets

STRUCTURE AND FORMATION METHOD OF SEMICONDUCTOR DEVICE WITH PHOTODETECTOR

BACKGROUND

The semiconductor integrated circuit (IC) industry has experienced rapid growth. Technological advances in IC materials and design have produced generations of ICs. Each generation has smaller and more complex circuits than the previous generation. Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

Silicon photonic devices may be made using existing semiconductor fabrication techniques. It is possible to create hybrid devices in which the optical and electronic components are integrated onto a single semiconductor chip. Silicon photonic devices are being actively developed and researched by using optical interconnects to provide faster data transfer both between and within semiconductor chips.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
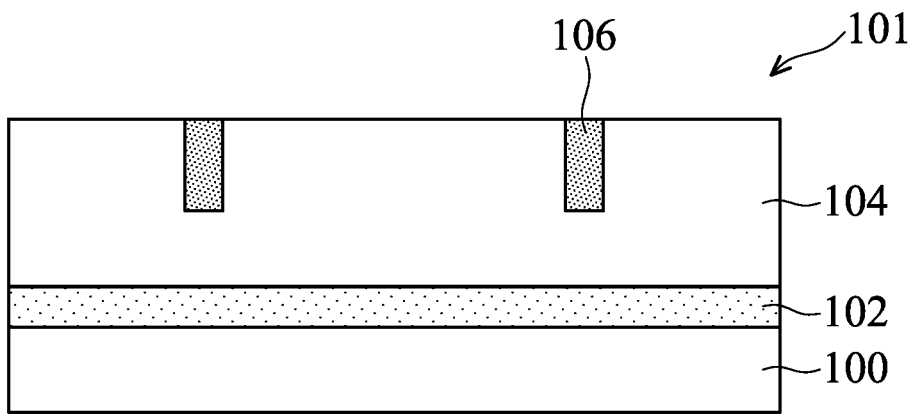
FIGS. 1A-1G are cross-sectional views of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the disclosure relate to a semiconductor device structure with one or more photodetectors. A photodetector is an optoelectronic device that is configured to receive photons of incident radiation and convert the photons into an electrical signal. Photodetectors may have many applications such as light detection devices, lidar devices, optical communication devices, image sensor devices, and the like.

FIGS. 1A-1G are cross-sectional views of a process for forming a portion of a semiconductor device structure, in accordance with some embodiments. As shown in FIG. 1A, a semiconductor substrate 101 is received or provided. In some embodiments, the semiconductor substrate 101 is a bulk semiconductor substrate, such as a semiconductor wafer. The semiconductor substrate 101 may include silicon or other elementary semiconductor materials such as germanium. In some embodiments, the semiconductor substrate 101 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 101 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 101 is a semiconductor-on-insulator (SOI) substrate. In some embodiments, the semiconductor substrate 101 includes a support substrate 100, an insulating layer 102, and a device layer 104, as shown in FIG. 1A. The support substrate 100 may be made of a semiconductor material such as silicon. The insulating layer 102 may be made of an oxide material such as silicon oxide. The device layer 104 may include a semiconductor material such as silicon. The SOI substrate may be fabricated using a separation by implantation of oxygen (SIMOX) process, a wafer bonding process, another applicable method, or a combination thereof.

As shown in FIG. 1A, multiple isolation structures 106 are formed in the device layer 104 of the semiconductor substrate 101, in accordance with some embodiments. The isolation structures 106 may be used to define various active regions in the semiconductor substrate 101 and to electrically isolate neighboring elements (such as n-type doped regions and p-type doped regions) from one another. The isolation structures 106 may be made of or include silicon oxide, silicon nitride, silicon oxynitride, fluoride-doped silicate glass (FSG), a low-K dielectric material, another suitable material, or a combination thereof. The isolation structures 106 may be formed by using an isolation technology, such as local oxidation of semiconductor (LOCOS), shallow trench isolation (STI), or the like.

In some embodiments, the formation of the isolation structures 106 includes patterning the device layer 104 of the semiconductor substrate 101 by a photolithography process, etching a trench in the semiconductor substrate 101 (for example, by using a dry etching, wet etching, plasma etching process, or a combination thereof), and filling the trench (for example, by using a chemical vapor deposition process) with one or more dielectric materials. In some embodiment, the filled trench may have a multi-layer structure, such as a thermal oxide liner layer filled with silicon nitride or silicon oxide.

Figure 1B:
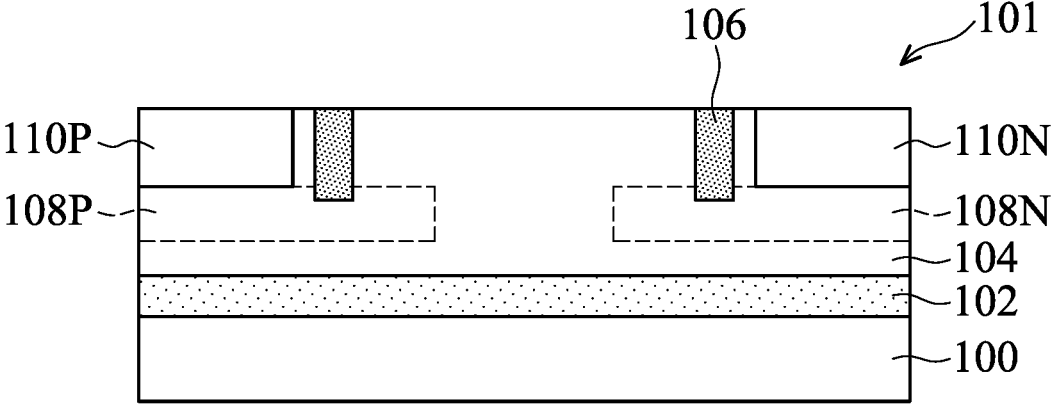

As shown in FIG. 1B, multiple doped structures 108P, 110P, 108N, and 110N are formed in the device layer 104 of the semiconductor substrate 101, in accordance with some embodiments. In some embodiments, the doped structures 108P and 110P are p-type doped regions formed in the device layer 104. The doped structures 108P and 110P include p-type dopants such as boron (B), gallium (Ga), indium (In), and/or another suitable dopant. In some embodiments, the dopant concentration of the doped structure 110P is higher than that of the doped structure 108P.

In some embodiments, the doped structures 108N and 110N are n-type doped regions formed in the device layer 104. The doped structures 108N and 110N include n-type dopants such as phosphor (P), antimony (Sb), arsenic (As), and/or another suitable dopant. In some embodiments, the dopant concentration of the doped structure 110N is higher than that of the doped structure 108N.

In some embodiments, multiple ion implantation processes are sequentially performed to sequentially form the doped structures 108P, 110P, 108N, and 110N. Multiple mask elements are used during the ion implantation processes, so as to selectively implant dopants into selective areas. As a result, the doped structures 108P, 110P, 108N, and 110N are formed. One or more annealing processes may be used to activate the dopants. For example, a rapid thermal annealing process is used.

Figure 1C:
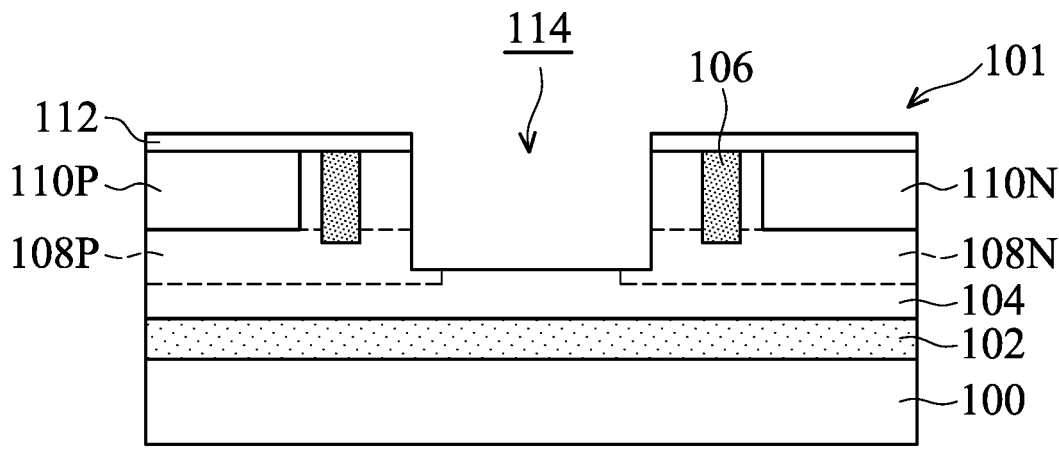

As shown in FIG. 1C, the device layer 104 of the semiconductor substrate 101 is partially removed to form a recess 114, in accordance with some embodiments. The recess 114 exposes a portion of the doped structure 108P that is p-type doped and a portion of the doped structure 108N that is n-type doped. In some embodiments, the doped structures 108P and 108N are partially removed during the formation of the recess 114. As a result, the recess 114 extends into the doped structures 108P and 108N. One or more photolithography processes and one or more etching processes may be used to form the recess 114.

In some embodiments, a patterned mask element 112 is formed over the semiconductor substrate 101 to assist in the formation of the recess 114. Afterwards, one or more etching processes are used to partially remove the semiconductor substrate 101. As a result, the recess 114 is formed. The patterned mask element 112 may be made of or include an oxide material such as silicon oxide.

Figure 1D:
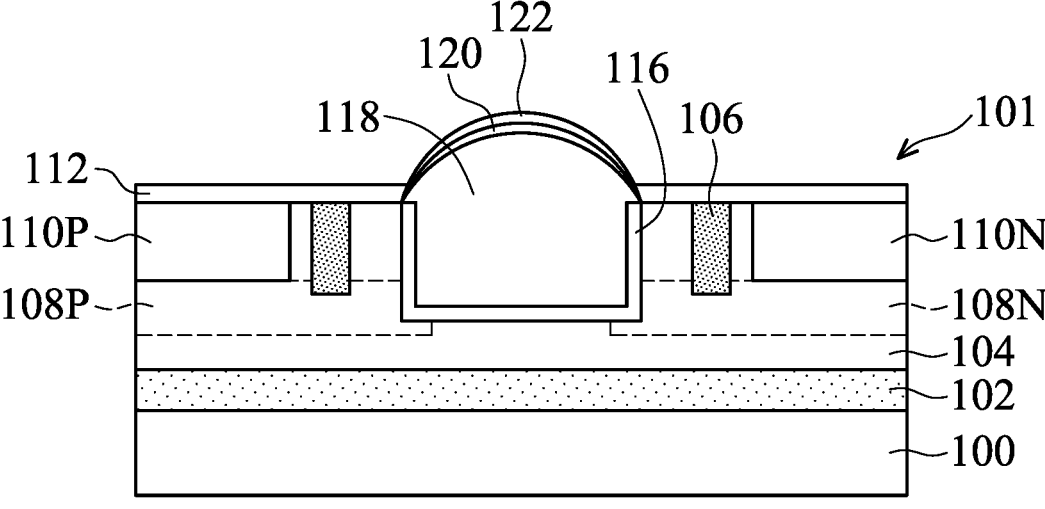

As shown in FIG. 1D, a buffer layer 116, a photo-sensing structure 118, a germanium-containing cap 120, and a silicon-containing cap 122 are sequentially formed to fill the recess 114, in accordance with some embodiments. In some embodiments, the buffer layer 116, the photo-sensing structure 118, the germanium-containing cap 120, and the silicon-containing cap 122 are epitaxially grown. In some embodiments, the buffer layer 116, the photo-sensing structure 118, the germanium-containing cap 120, and the silicon-containing cap 122 are epitaxially grown in-situ in the same process chamber.

Figures 9, 10:
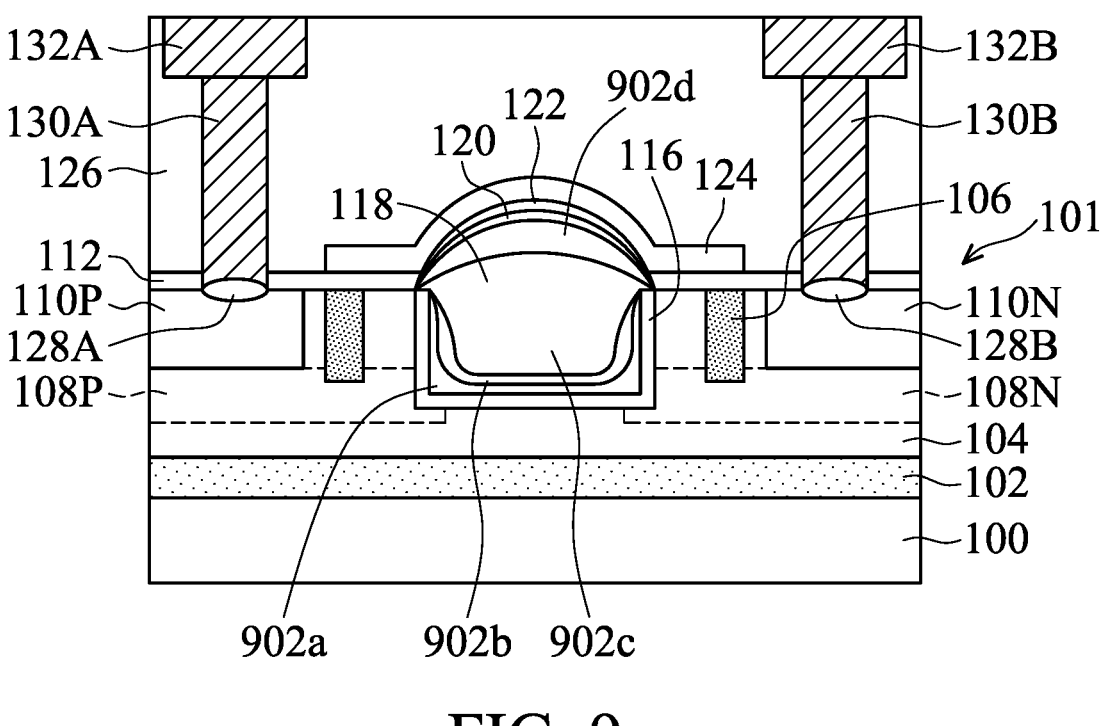
FIG. 9 is a cross-sectional view of a portion of a semiconductor device structure, in accordance with some embodiments.
FIG. 10 shows a portion of a process chamber used in a process for forming a portion of a semiconductor device structure, in accordance with some embodiments.

FIG. 10 shows a portion of a process chamber 1000 used in a process for forming a portion of a semiconductor device structure, in accordance with some embodiments. In some embodiments, the process chamber 1000 has a substrate holder 1002. The substrate holder 1002 may be used to hold and secure a substrate such as a wafer. For example, a wafer that includes the structure shown in FIG. 1C may be placed on the substrate holder 1002. Afterwards, multiple processes may be performed to the wafer within the process chamber 1000.

In some embodiments, the buffer layer 116, the photo-sensing structure 118, the germanium-containing cap 120, and the silicon-containing cap 122 are sequentially epitaxially grown in-situ in the process chamber 1000. Each of the buffer layer 116, the photo-sensing structure 118, the germanium-containing cap 120, and the silicon-containing cap 122 may be formed using a selective epitaxial growth (SEG) process, a chemical vapor deposition (CVD) process (e.g., a vapor-phase epitaxy (VPE) process, a low-pressure chemical vapor deposition (LPCVD) process, an ultra-high vacuum CVD (UHV-CVD) process), a molecular beam epitaxy process, one or more other applicable processes, or a combination thereof.

In some embodiments, the vacuum of the process chamber 1000 is not broken during the epitaxial growth of the buffer layer 116, the photo-sensing structure 118, the germanium-containing cap 120, and the silicon-containing cap 122. The formation of the buffer layer 116, the photo-sensing structure 118, the germanium-containing cap 120, and the silicon-containing cap 122 is thus prevented from being negatively affected by the environment outside of the process chamber 1000. For example, the surfaces of these elements may be prevented from being oxidized by moisture outside of the process chamber 1000. The interface between the neighboring elements may thus have good quality and low defect density. The reliability and quality of these elements are improved.

In some embodiments, the buffer layer 116 is epitaxially grown on the sidewalls and bottom of the recess 114. In some embodiments, the buffer layer 116 is made of or includes germanium. In some embodiments, the buffer layer 116 is free of tin. In some embodiments, the buffer layer 116 extends conformally along the sidewalls and bottom of the recess 114. In some embodiments, the buffer layer 116 is in direct contact with device layer 104 and the doped structures 108P and 108N. The buffer layer 116 may have a thickness that is within a range from about 10 nm to about 100 nm.

Afterwards, the photo-sensing structure 118 is epitaxially grown on the buffer layer 116. In some embodiments, the photo-sensing structure 118 is a photo-sensing epitaxial structure. In some embodiments, the photo-sensing structure 118 is a germanium-based epitaxial structure that contains tin. In some embodiments, the photo-sensing structure 118 is free of the p-type dopants and the n-type dopants that are included in the doped structures 108P, 110P, 108N, and 110N. In some embodiments, the photo-sensing structure 118 is intrinsic without being doped with any n-type dopants or p-type dopants. The photo-sensing structure 118 may have a thickness that is within a range from about 100 nm to about 2 μm.

In some embodiments, the upper portion of the photo-sensing structure 118 protrudes from the top surface of the semiconductor substrate 101, as shown in FIG. 1D. In some embodiments, the photo-sensing structure 118 has a curved top surface. In some embodiments, the curvature center of the curved top surface of the photo-sensing structure 118 is positioned between the curved top surface and the bottom surface of the semiconductor substrate 101. In some embodiments, the curvature center of the curved top surface of the photo-sensing structure 118 is positioned within the photo-sensing structure 118. In some embodiments, the bottommost surface of the photo-sensing structure 118 is positioned at a higher level than those of the doped structures 108P, 110P, 108N, and 110N, as shown in FIG. 1D.

In some cases, pure germanium may be used as the photo-sensing structure for silicon photonic photodetector in the O-band (around 1310 nm). However, due to material limit, the absorption coefficient of the pure germanium epitaxial structure in the C-band (around 1550 nm) may drop over twenty times when compared with O-band, which limit the application of a germanium-based photodetector. In some embodiments, with the incorporation of tin, the germanium and tin-containing epitaxial structure may have improved absorption coefficient in the C-band. The incorporation of tin may cause tensile strain to the photo-sensing structure 118, which may help to reduce the energy bandgap. As a result, a light incident with longer wavelength (such as that around C-band) may have sufficient energy to create electron-hole pairs in the photo-sensing structure 118, which can then be detected as a current or voltage.

The amount of the tin in the photo-sensing structure 118 should be carefully adjusted, so as to ensure the performance of the photo-sensing structure 118. In some embodiments, the photo-sensing structure 118 has an atomic concentration of tin that is within a range from about 1% to about 15%. In some other embodiments, the photo-sensing structure 118 has an atomic concentration of tin that is within a range from about 2% to about 4%.

In some cases, if the atomic concentration of tin of the photo-sensing structure 118 is lower than about 1%, the amount of tin may be too low such that the energy band gap remains high. The absorption coefficient in the C-band may not be sufficient. In some other cases, if the atomic concentration of tin of the photo-sensing structure 118 is higher than about 15%, the amount of tin may be too much, which may induce the formation of defects and may tend to increase undesired dark current.

In some embodiments, the photo-sensing structure 118 is epitaxially grown in-situ in the process chamber 1000 where the buffer layer 116 is grown. The vacuum of the process chamber 1000 is not broken during the epitaxial growth of the buffer layer 116 and the photo-sensing structure 118. The photo-sensing structure 118 is epitaxially grown in-situ in the process chamber 1000 right after the growth of the buffer layer 116. Without being taken out of the process chamber

1000, the surface of the buffer layer 116 is prevented from being oxidized before the subsequent growth of the photo-sensing structure 118.

In some embodiments, there is no oxide layer or oxide element formed between the buffer layer 116 and the photo-sensing structure 118. The interface quality between the buffer layer 116 and the photo-sensing structure 118 is thus ensured, which significantly reduce the amounts of defects. The performance and reliability of the photo-sensing structure 118 are greatly improved.

The lattice mismatch between the buffer layer 116 and the device layer 104 of the semiconductor substrate 101 is lower than the lattice mismatch between the photo-sensing structure 118 and the device layer 104 of the semiconductor substrate 101. With buffer layer 116, defects that are cause by lattice mismatch may be significantly reduced. The performance and reliability of the photo-sensing structure 118 are improved further.

Afterwards, the germanium-containing cap 120 is epitaxially grown on the photo-sensing structure 118, as shown in FIG. 1D in accordance with some embodiments. The germanium-containing cap 120 may be made of or include germanium. The germanium-containing cap 120 may be made of or include pure germanium, silicon germanium, another suitable germanium-containing material, or a combination thereof. In some embodiments, the germanium-containing cap 120 is made of silicon germanium having a composition defined by the formula $Si_{(1-X)}Ge_X$, where (1-X) and X represent relative proportions. Each of them is greater than zero, and added together they equal 1. The proportion X may be within a range from about 10% to about 80%. The germanium-containing cap 120 may have a thickness that is within a range from about 5 nm to about 50 nm.

In some embodiments, the germanium-containing cap 120 is in direct contact with the photo-sensing structure 118. In some embodiments, the germanium-containing cap 120 extends conformally along the curved top surface of the photo-sensing structure 118. In some embodiments, the germanium-containing cap 120 also has a curved top surface.

In some embodiments, the germanium-containing cap 120 is epitaxially grown in-situ in the process chamber 1000 where the buffer layer 116 and the photo-sensing structure 118 are grown. The vacuum of the process chamber 1000 is not broken during the epitaxial growth of the buffer layer 116, the photo-sensing structure 118, and the germanium-containing cap 120. The germanium-containing cap 120 is epitaxially grown in-situ in the process chamber 1000 right after the growth of the photo-sensing structure 118. Without being taken out of the process chamber 1000, the surface of the photo-sensing structure 118 is prevented from being oxidized before the subsequent growth of the germanium-containing cap 120.

In some embodiments, there is no oxide layer or oxide element formed between the germanium-containing cap 120 and the photo-sensing structure 118. The interface quality between the germanium-containing cap 120 and the photo-sensing structure 118 is thus ensured, which significantly reduce the amounts of defects. The performance and reliability of the photo-sensing structure 118 are greatly improved.

As shown in FIG. 1D, the silicon-containing cap 122 is epitaxially grown on the germanium-containing cap 120, in accordance with some embodiments. The silicon-containing cap 122 may be made of or include silicon. The silicon-containing cap 122 may be made of or include pure silicon, silicon germanium, another suitable silicon-containing material, or a combination thereof. In some embodiments, the silicon-containing cap 122 has a higher atomic concentration of silicon than that of the germanium-containing cap 120. The silicon-containing cap 122 may have a thickness that is within a range from about 5 nm to about 50 nm.

In some embodiments, the silicon-containing cap 122 is in direct contact with the germanium-containing cap 120. In some embodiments, the silicon-containing cap 122 is separated from the photo-sensing structure 118 by the germanium-containing cap 120. In some embodiments, the silicon-containing cap 122 extends conformally along the curved top surface of the germanium-containing cap 120. In some embodiments, the silicon-containing cap 122 also has a curved top surface.

In some embodiments, the silicon-containing cap 122 is epitaxially grown in-situ in the process chamber 1000 where the buffer layer 116, the photo-sensing structure 118, and the germanium-containing cap 120 are grown. The vacuum of the process chamber 1000 is not broken during the epitaxial growth of the buffer layer 116, the photo-sensing structure 118, the germanium-containing cap 120, and the silicon-containing cap 122. The silicon-containing cap 122 is epitaxially grown in-situ in the process chamber 1000 right after the growth of the germanium-containing cap 120. Without being taken out of the process chamber 1000, the surface of the germanium-containing cap 120 is prevented from being oxidized before the subsequent growth of the silicon-containing cap 122.

In some embodiments, there is no oxide layer or oxide element formed between the germanium-containing cap 120 and the silicon-containing cap 122. The silicon-containing cap 122 may be used to prevent germanium in the germanium-containing cap 120 and the photo-sensing structure 118 from diffusing into the elements around the photo-sensing structure 118. The performance and reliability of the semiconductor device structure may therefore be improved.

The lattice mismatch between the silicon-containing cap 122 and the germanium-containing cap 120 is lower than the lattice mismatch between the photo-sensing structure 118 and silicon-containing cap 122. With the buffer of the germanium-containing cap 120, defects that are cause by lattice mismatch may be significantly reduced. The performance and reliability of the photo-sensing structure 118 are improved further.

In some embodiments, the operation temperature of the process chamber 1000 may be kept at a high temperature that is within a range from about 300 degrees C. to about 600 degrees C. In some embodiments, the photo-sensing structure 118 has a higher coefficient of thermal expansion than that of the semiconductor substrate 101. After being taken out of the process chamber 1000, the photo-sensing structure 118 may shrink more than the semiconductor substrate 101. As a result, tensile strain may be generated within the photo-sensing structure 118, which may help to reduce the energy bandgap of the photo-sensing structure 118. As a result, a light incident with longer wavelength (such as that around C-band) may have sufficient energy to create electron-hole pairs in the photo-sensing structure 118, which can then be detected as a current or voltage. The responsivity of the photo-sensing structure 118 may be improved.

Figure 1E:
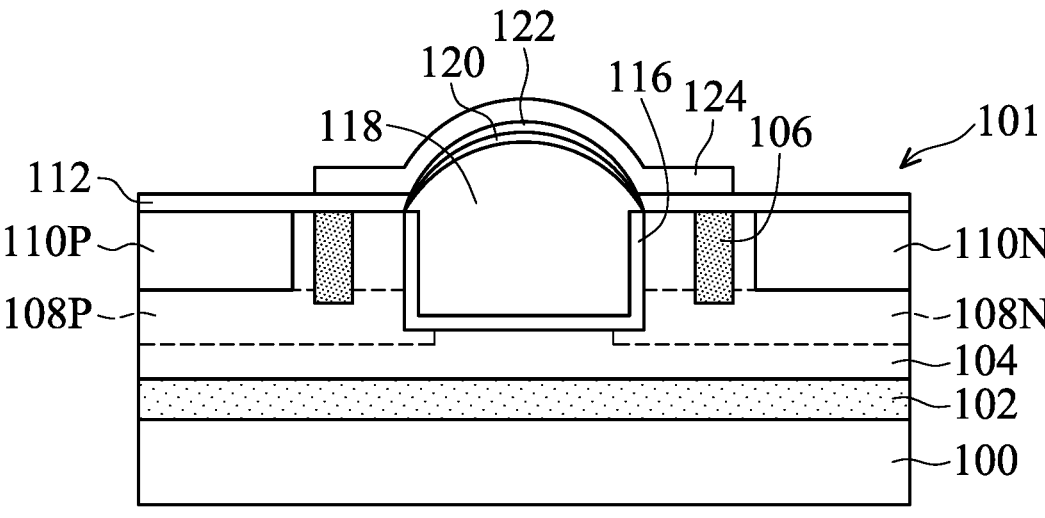

As shown in FIG. 1E, a protective element 124 is formed over the silicon-containing cap 122, in accordance with some embodiments. In some embodiments, the protective element 124 laterally extends past the opposite edges of the photo-sensing structure 118.

The protective element 124 may be made of or includes an oxide material, a nitride material, another suitable material, or a combination thereof. The protective element 124 may be made of or include silicon oxide, silicon nitride, silicon oxynitride, carbon-containing silicon oxide, carbon-containing silicon oxynitride, carbon-containing silicon nitride, or a combination thereof. A protective material layer may be deposited and then patterned to form the protective element 124.

In some embodiments, the protective element 124 is made of a nitrogen-containing material such as silicon nitride, silicon oxynitride, and the like. The protective element 124 may also function as a stressor that induces tensile strain in the photo-sensing structure 118. The performance of the photo-sensing structure 118 may thus be improved.

Figure 1F:
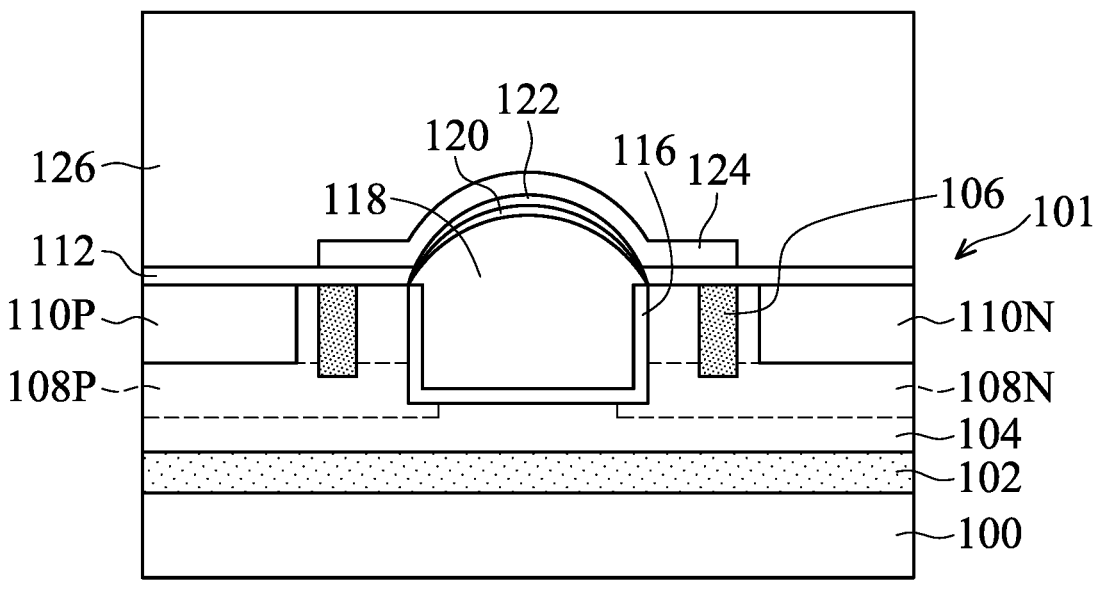

As shown in FIG. 1F, a dielectric layer 126 is deposited over the semiconductor substrate 101 and the photo-sensing structure 118, in accordance with some embodiments. The dielectric layer 126 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. The dielectric layer 126 may be deposited using a chemical vapor deposition (CVD) process, an atomic layer deposition (ALD) process, a flowable chemical vapor deposition (FCVD) process, another applicable process, or a combination thereof.

In some embodiments, before the formation of the dielectric layer 126, a contact etch stop layer is deposited over the semiconductor substrate 101 and the protective element 124. The contact etch stop layer may be made of or include silicon nitride, silicon oxynitride, silicon carbide, aluminum oxide, another suitable material, or a combination thereof.

Figure 1G:
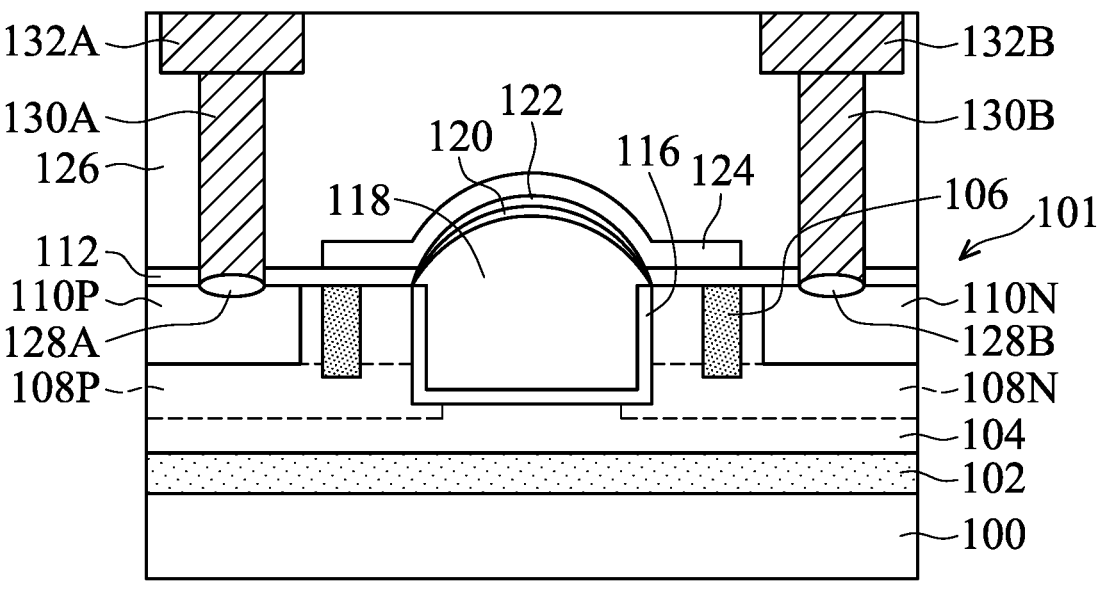

As shown in FIG. 1G, conductive features 130A, 130B, 132A, and 132B are formed, in accordance with some embodiments. The conductive features 130A and 132A are electrically connected to the doped structure 108P through the doped structure 110P. The conductive features 130B and 132B are electrically connected to the doped structure 108N through the doped structure 110N. In some embodiments, the conductive features 130A and 130B are conductive contacts that provide electrical connections to the doped structures 110P and 110N, respectively. In some embodiments, the conductive features 132A and 132B are conductive lines. The conductive features 130A, 130B, 132A, and 132B may be made of or include copper, aluminum, tungsten, cobalt, another suitable material, or a combination thereof.

In some embodiments, a semiconductor-metal compound structure 128A is formed between the conductive feature 130A and the doped structure 110P, as shown in FIG. 1G. A semiconductor-metal compound structure 128B is formed between the conductive feature 130B and the doped structure 110N. In some embodiments, the semiconductor-metal compound structures 128A and 128B are made of or include metal silicide materials. The semiconductor-metal compound structures 128A and 128B may include the silicide of titanium, nickel, cobalt, tungsten, another suitable material, or a combination thereof.

In some embodiments, the semiconductor-metal compound structure 128A further includes p-type dopants. In some embodiments, the p-type dopants in the semiconductor-metal compound structure 128A are the same as the p-type dopants in the doped structure 110P. In some embodiments, the semiconductor-metal compound structure 128B further includes n-type dopants. In some embodiments, the n-type dopants in the semiconductor-metal compound structure 128B are the same as the n-type dopants in the doped structure 110N.

In some embodiments, one or more photolithography processes and one or more etching processes are used to form the openings that are used to contain the conductive features 130A, 130B, 132A, and 132B and the semiconductor-metal compound structures 128A and 128B. The openings expose the doped structures 110P and 110N.

Afterwards, a metal layer is deposited on the exposed portions of the doped structures 110P and 110N. A thermal operation is used to initiate the reaction between the metal layer and the doped structures 110P and 110N. As a result, the semiconductor-metal compound structures 128A and 128B are formed. In some embodiments, the thermal operation is performed after the formation of the metal layer. In some other embodiments, the thermal operation is performed during the formation of the metal layer. In some embodiments, the portions of the metal layer that are not formed into the semiconductor-metal compound structures 128A and 128B are then removed or formed into barrier layers. Afterwards, one or more conductive material layers are formed to overfill the openings. A planarization process is the used to remove the portion of the conductive material layers that are outside of the openings. As a result, the remaining portions of the conductive material layers form the conductive features 130A, 130B, 132A, and 132B.

Figure 2:
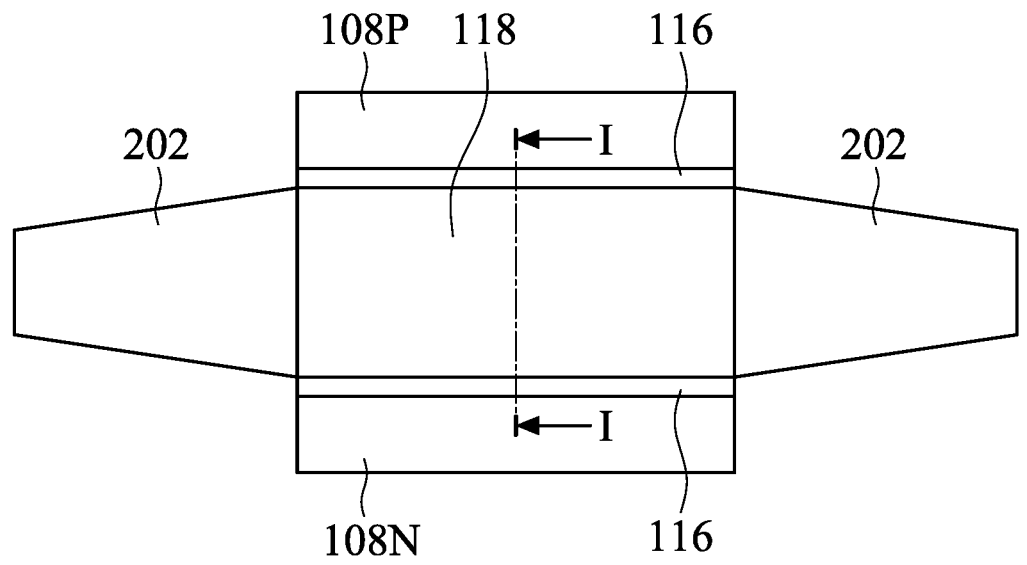
FIG. 2 is a cross-sectional view of a portion of a semiconductor device structure, in accordance with some embodiments.

FIG. 2 is a cross-sectional view of a portion of a semiconductor device structure, in accordance with some embodiments. In some embodiments, FIG. 2 shows a horizontal cross-sectional view of a portion of a semiconductor device structure. In some embodiments, the structure shown in FIG. 1D is taken along the line I-I in FIG. 2. For clarity, some elements such as the germanium-containing cap 120, the silicon-containing cap 122, the patterned mask element 112, and the isolation structures 106 are not shown in FIG. 2. In some embodiments, some portions of the device layer 104 function as a core of the waveguide structure 202. The waveguide structure 202 may further include the insulating layer 102 and the dielectric layer 126 that is then formed.

In some embodiments, the core of the waveguide structure 202 has a first refractive index, and the structure surrounding the core has a second refractive index. The first refractive index is higher than the second refractive index. Therefore, when a light beam is directed into the waveguide structure 202, the light beam is confined within the core by total internal reflection as the light beam propagates along the length of the waveguide structure 202.

In some embodiments, the doped structure 108P, the photo-sensing structure 118, and the doped structure 108N together form a p-i-n diode. In some embodiments, the p-i-n diode is reverse biased. In some embodiments, the doped structure 108P is negatively charged, and the doped structure 108N is positively charged.

In some embodiments, light is guided by the waveguide structure 202 and incident on the photo-sensing structure 118. As a result, electron-hole pairs are generated due to the absorption of photons. These electrons and holes are separated by the electric field between the doped structures 108P and 108N that are reverse biased, and a current is produced. The magnitude of this current may be proportional to the intensity of the incident light.

Figure 3:
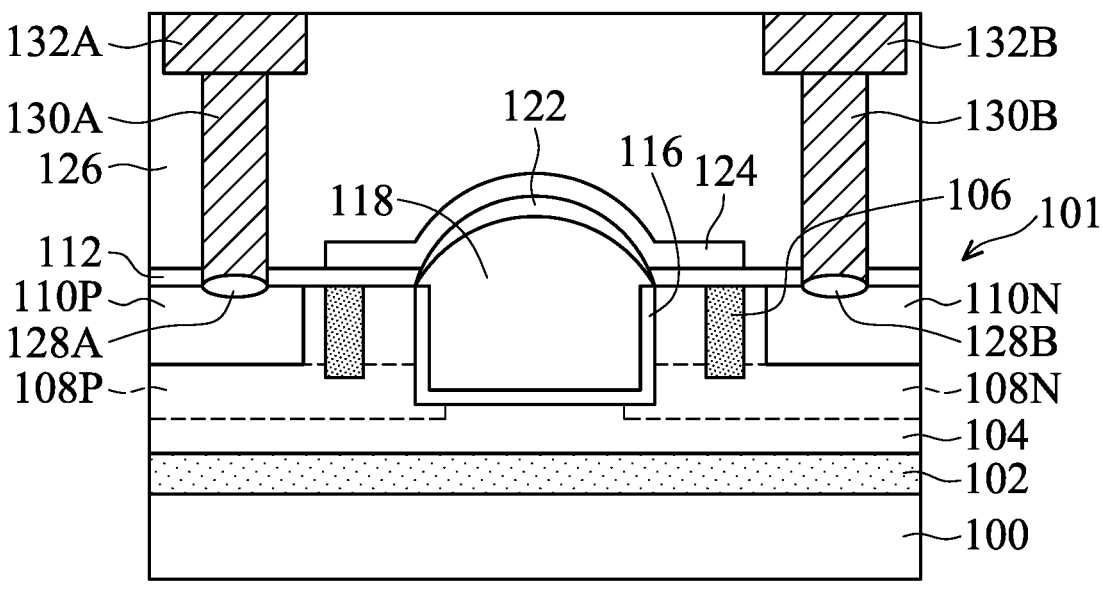
FIG. 3 is a cross-sectional view of a portion of a semiconductor device structure, in accordance with some embodiments.

Many variations and/or modifications can be made to embodiments of the disclosure. FIG. 3 is a cross-sectional view of a portion of a semiconductor device structure, in accordance with some embodiments. In some embodiments, the germanium-containing cap 120 is not formed. In some embodiments, the silicon-containing cap 122 is in direct contact with the photo-sensing structure 118.

In some embodiments, the bottommost surface of the photo-sensing structure 118 is positioned higher than the bottommost surfaces of the doped structures 108P and 108N. However, embodiments of the disclosure are not limited thereto. Many variations and/or modifications can be made to embodiments of the disclosure.

Figure 4:
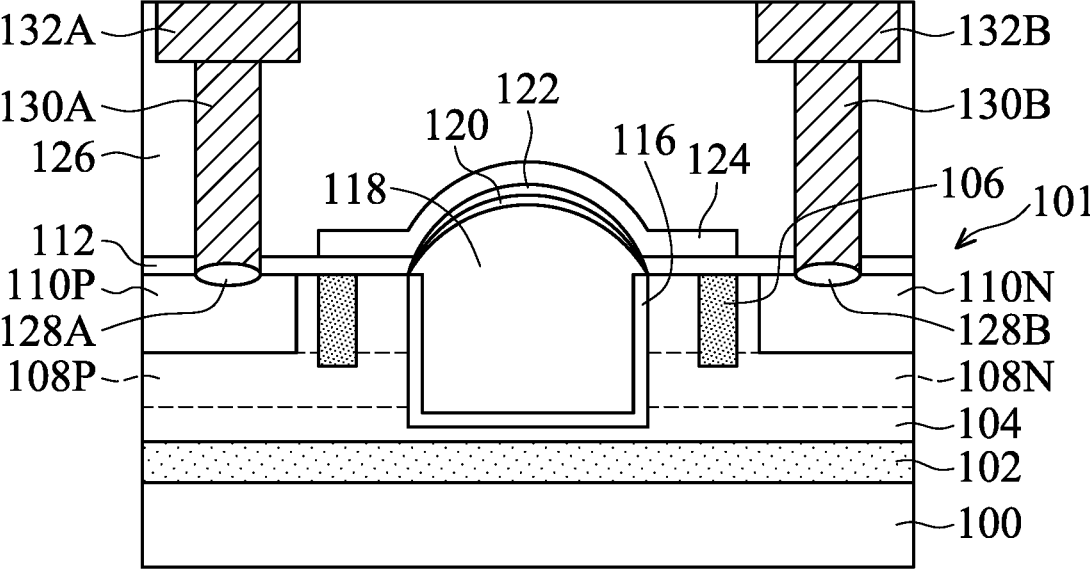
FIG. 4 is a cross-sectional view of a portion of a semiconductor device structure, in accordance with some embodiments.

FIG. 4 is a cross-sectional view of a portion of a semiconductor device structure, in accordance with some embodiments. In some embodiments, the recess 114 that is used to contain the photo-sensing structure 118 is formed to penetrate through the bottommost surfaces of the doped structures 108P and 108N. In some embodiments, the photo-sensing structure 118 penetrates through opposite surfaces of the doped structure 108N. In some embodiments, the photo-sensing structure 118 penetrates through opposite surfaces of the doped structure 108P. In some embodiments, the electron-hole pairs generated due to the absorption of photons may be separated by the electric field between the doped structures 108P and 108N more easily since the overlapped area between the photo-sensing structure 118 and the doped structures 108P and 108N is increased.

Figure 5:
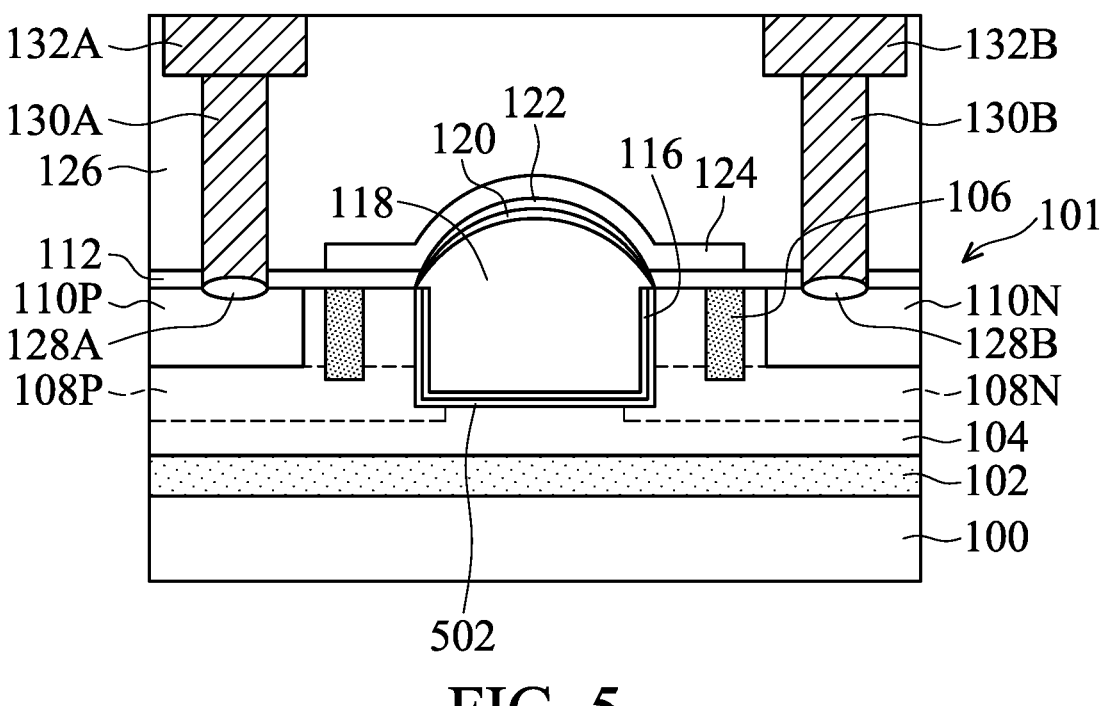
FIG. 5 is a cross-sectional view of a portion of a semiconductor device structure, in accordance with some embodiments.

Many variations and/or modifications can be made to embodiments of the disclosure. FIG. 5 is a cross-sectional view of a portion of a semiconductor device structure, in accordance with some embodiments. In some embodiments, a buffer layer 502 is epitaxially grown on the sidewalls and bottom of the recess 114 before the formation of the buffer layer 116. In some embodiments, the buffer layer 502 is made of or includes silicon germanium. In some embodiments, the buffer layer 502 is free of tin. In some embodiments, the buffer layers 502 and 116 are epitaxially grown in-situ in the process chamber 1000.

In some embodiments, the buffer layer 502 extends conformally along the sidewalls and bottom of the recess 114. In some embodiments, the buffer layer 502 is in direct contact with device layer 104 and the doped structures 108P and 108N. The buffer layer 502 may have a thickness that is within a range from about 10 nm to about 100 nm.

In some embodiments, the lattice mismatch between the buffer layer 502 and the device layer 104 of the semiconductor substrate 101 is lower than the lattice mismatch between the buffer layer 116 and the device layer 104 of the semiconductor substrate 101. With the buffer layer 502, defects that are cause by lattice mismatch may be reduced further.

Figure 6:
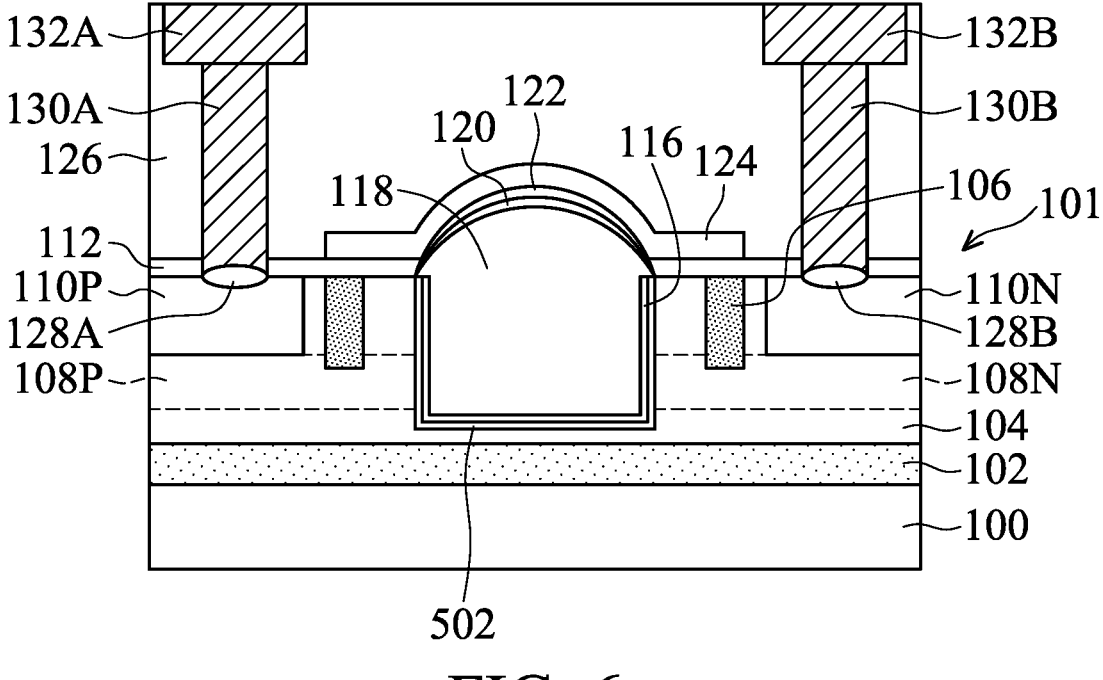
FIG. 6 is a cross-sectional view of a portion of a semiconductor device structure, in accordance with some embodiments.

Many variations and/or modifications can be made to embodiments of the disclosure. FIG. 6 is a cross-sectional view of a portion of a semiconductor device structure, in accordance with some embodiments. Similar to the structure shown in FIGS. 4 and 5, the buffer layer 502 is formed between the buffer layer 116 and the semiconductor substrate 101. In some embodiments, the photo-sensing structure 118 penetrates through opposite surfaces of the doped structure 108N. In some embodiments, the photo-sensing structure 118 penetrates through opposite surfaces of the doped structure 108P.

In some embodiments, the photo-sensing structure 118 is in direct contact with the germanium-containing cap 120. However, embodiments of the disclosure are not limited thereto. Many variations and/or modifications can be made to embodiments of the disclosure.

Figure 7:
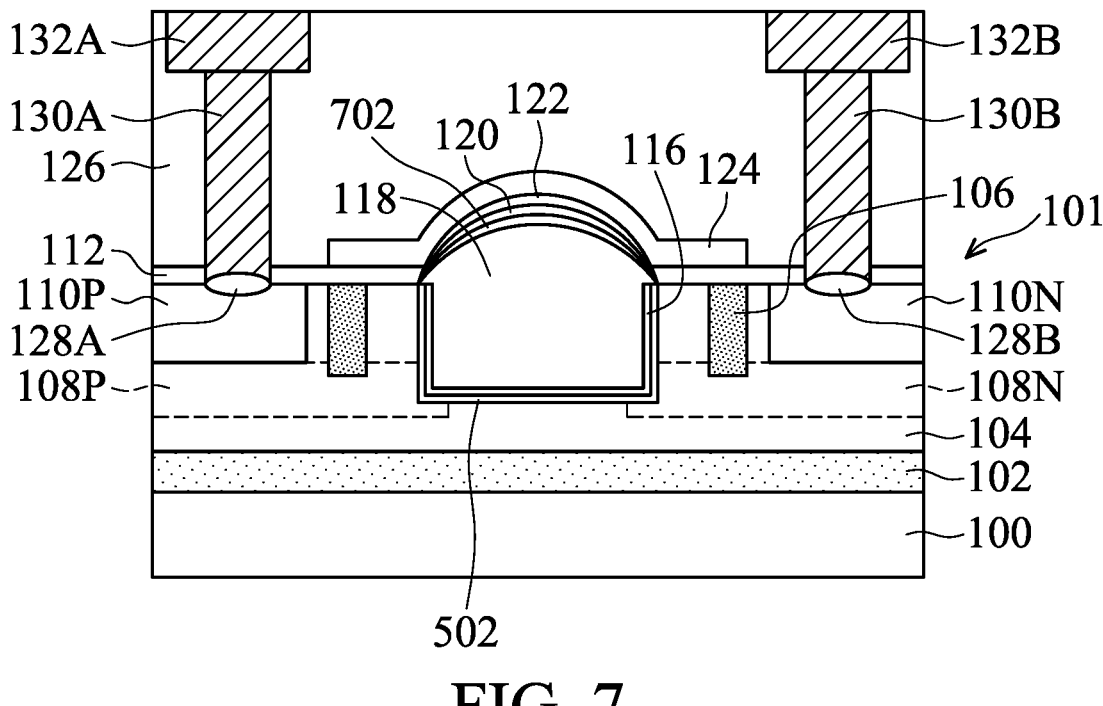
FIG. 7 is a cross-sectional view of a portion of a semiconductor device structure, in accordance with some embodiments.

FIG. 7 is a cross-sectional view of a portion of a semiconductor device structure, in accordance with some embodiments. In some embodiments, a germanium cap 702 is epitaxially grown on the photo-sensing structure 118 before the formation of the germanium-containing cap 120. In some embodiments, the germanium cap 702 is in direct contact with the photo-sensing structure 118. In some embodiments, the germanium cap 702 is made of pure germanium. In some embodiments, the atomic concentration of germanium of the germanium cap 702 is higher than the atomic concentration of germanium of the germanium-containing cap 120. In some embodiments, the germanium cap 702 and the photo-sensing structure 118 are epitaxially grown in-situ in the process chamber 1000.

In some embodiments, the lattice mismatch between the germanium-containing cap 120 and the germanium cap 702 is lower than the lattice mismatch between the photo-sensing structure 118 and germanium-containing cap 120. With the buffer of the germanium cap 702, defects that are cause by lattice mismatch may be significantly reduced. The performance and reliability of the photo-sensing structure 118 are improved further.

Figure 8:
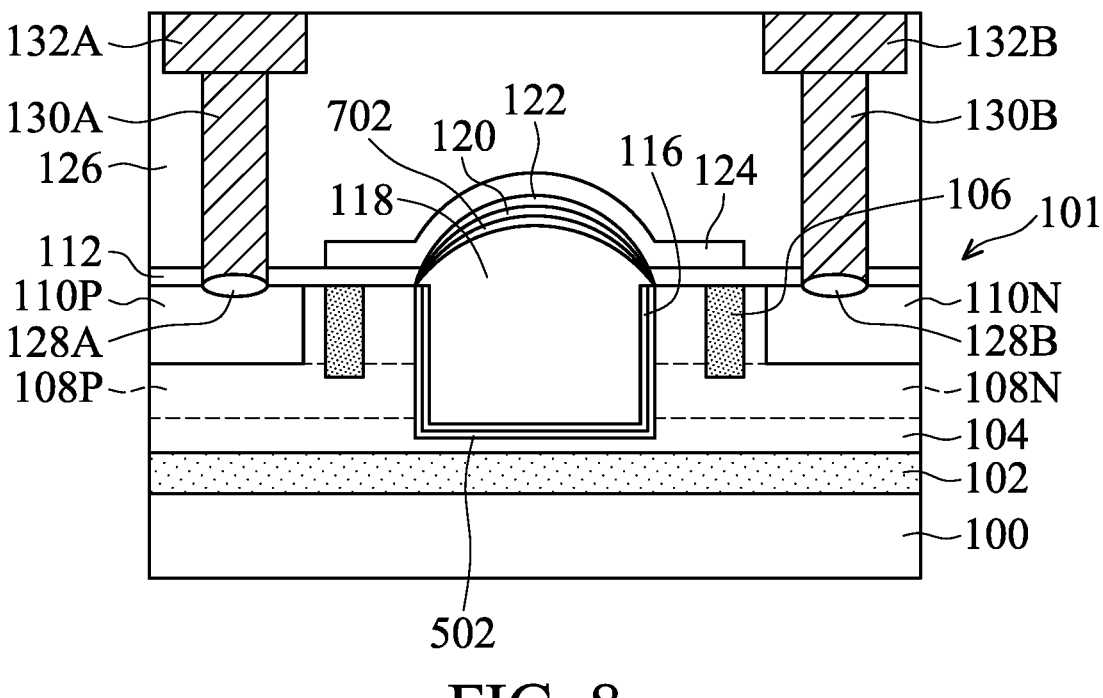
FIG. 8 is a cross-sectional view of a portion of a semiconductor device structure, in accordance with some embodiments.

Many variations and/or modifications can be made to embodiments of the disclosure. FIG. 8 is a cross-sectional view of a portion of a semiconductor device structure, in accordance with some embodiments. Similar to the structure shown in FIGS. 7 and 5, the germanium cap 702 is formed between the germanium-containing cap 120 and the photo-sensing structure 118. In some embodiments, the photo-sensing structure 118 penetrates through opposite surfaces of the doped structure 108N. In some embodiments, the photo-sensing structure 118 penetrates through opposite surfaces of the doped structure 108P.

In some embodiments, the atomic concentrations of tin of different portions of the photo-sensing structure 118 are substantially the same. However, embodiments of the disclosure are not limited thereto. Many variations and/or modifications can be made to embodiments of the disclosure.

FIG. 9 is a cross-sectional view of a portion of a semiconductor device structure, in accordance with some embodiments. In some embodiments, the reaction gas mixture used for growing the photo-sensing structure 118 may be tuned during the growth of the photo-sensing structure 118. As a result, the atomic concentrations of tin of different portions of the photo-sensing structure 118 are different from each other.

In some embodiments, the photo-sensing structure 118 has multiple portions 902a, 902b, 902c, and 902d. In some embodiments, the inner portion of the photo-sensing structure 118 (such as the portion 902c) has a higher atomic concentration of tin than the atomic concentration of tin of the outer portion of the photo-sensing structure 118 (such as the portion 902b or 902d). In some embodiments, the portion 902b has a higher atomic concentration of tin than that of the portion 902a.

Since the outer portion of the photo-sensing structure 118 has a lower atomic concentration of tin, the mismatch between the photo-sensing structure 118 and the elements surrounding the photo-sensing structure 118 may be lowered. Defects that are cause by lattice mismatch may be reduced further, which may improve the performance and reliability of the photo-sensing structure 118.

Embodiments of the disclosure include a semiconductor device structure with photodetector. The photodetector includes a germanium-based photo-sensing structure. The absorption coefficient in the C-band of the germanium-based photo-sensing structure may be significantly increased by incorporating tin into the germanium-based photo-sensing structure. One or more buffer layers and/or one or more protective caps are formed to surround and protect the germanium-based photo-sensing structure, so as to reduce the formation of defects in the photo-sensing structure. Photodetectors with high responsivity, low dark current density, and high bandwidth are thus obtained. The performance and reliability of the semiconductor device structure are greatly improved.

In accordance with some embodiments, a semiconductor device structure is provided. The semiconductor device structure includes a substrate and a p-type doped structure formed in the substrate. The semiconductor device structure also includes an n-type doped structure formed in the substrate. The semiconductor device structure further includes a photo-sensing epitaxial structure partially or completely surrounded by the substrate. A portion of the photo-sensing epitaxial structure is between the p-type doped structure and the n-type doped structure, and the photo-sensing epitaxial structure contains germanium and tin.

In accordance with some embodiments, a semiconductor device structure is provided. The semiconductor device structure includes a photo-sensing epitaxial structure containing tin. The semiconductor device structure also includes a p-type doped structure and an n-type doped structure disposed over opposite sides of the photo-sensing epitaxial structure. The semiconductor device structure further includes a buffer layer surrounding a bottom and sidewalls of the photo-sensing epitaxial structure. The buffer layer is between the photo-sensing epitaxial structure and the p-type doped structure. The buffer layer is between the photo-sensing epitaxial structure and the n-type doped structure.

In accordance with some embodiments, a method for forming a semiconductor device structure is provided. The method includes forming a p-type doped region and an n-type doped region in a semiconductor substrate. The method also includes partially removing the semiconductor substrate to form a recess exposing portions of the p-type doped region and the n-type doped region. The method further includes forming a buffer layer along sidewalls and a bottom of the recess. In addition, the method includes epitaxially growing a photo-sensing structure over the buffer layer. The photo-sensing structure contains germanium and tin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

forming a p-type doped region and an n-type doped region in a semiconductor substrate;

partially removing the semiconductor substrate to form a recess exposing portions of the p-type doped region and the n-type doped region;

forming a buffer layer along sidewalls and a bottom of the recess; and epitaxially growing a photo-sensing structure over the buffer layer, wherein the photo-sensing structure contains germanium and tin, and the photo-sensing structure is closer to a bottom of the semiconductor substrate than the n-type doped region.

2. The method for forming a semiconductor device structure as claimed in claim 1, wherein the buffer layer and the photo-sensing structure are epitaxially grown in-situ in a process chamber.

3. The method for forming a semiconductor device structure as claimed in claim 2, further comprising:

forming a silicon germanium cap directly on the photo-sensing structure.

4. The method for forming a semiconductor device structure as claimed in claim 3, wherein the silicon germanium cap is epitaxially grown in-situ in the process chamber.

5. The method for forming a semiconductor device structure as claimed in claim 4, further comprising:

forming a nitrogen-containing stressor layer over the silicon germanium cap.

6. The method for forming a semiconductor device structure as claimed in claim 1, wherein the photo-sensing structure has an atomic concentration of tin within a range from about 1% to about 15%.

7. The method for forming a semiconductor device structure as claimed in claim 1, further comprising:

forming a silicon germanium buffer layer along the sidewalls and the bottom of the recess before the buffer layer is formed.

8. The method for forming a semiconductor device structure as claimed in claim 1, wherein the photo-sensing structure is formed to have an inner portion and an outer portion, the outer portion is closer to a bottom of the buffer layer than the inner portion, the inner portion has a first atomic concentration of tin, the outer portion has a second atomic concentration of tin, and the first atomic concentration of tin is higher than the second atomic concentration of tin.

9. The method for forming a semiconductor device structure as claimed in claim 1, wherein the buffer layer is substantially free of tin.

10. A method for forming a semiconductor device structure, comprising:

forming a p-type doped structure and an n-type doped structure surrounded by a substrate;

partially removing the substrate to form a recess partially exposing the p-type doped structure and the n-type doped structure;

forming a buffer layer along sidewalls and a bottom of the recess, wherein the buffer layer extends across a top and a bottom of the p-type doped structure; and epitaxially growing a photo-sensing structure over the buffer layer, wherein the photo-sensing structure is a germanium-based epitaxial structure that contains tin.

11. The method for forming a semiconductor device structure as claimed in claim 10, wherein the buffer layer and the photo-sensing structure are epitaxially grown in-situ in a process chamber.

12. The method for forming a semiconductor device structure as claimed in claim 10, further comprising:

forming a second p-type doped structure and a second n-type doped structure, wherein the second p-type doped structure is over the p-type doped structure, the second n-type doped structure is over the n-type doped structure, the second p-type doped structure has a higher dopant concentration than the p-type doped structure, and the second n-type doped structure has a higher dopant concentration than the n-type doped structure.

13. The method for forming a semiconductor device structure as claimed in claim 12, further comprising:

forming a first semiconductor-metal compound structure over the second p-type doped structure, wherein the first semiconductor-metal compound structure contains p-type dopants;

forming a second semiconductor-metal compound structure over the second n-type doped structure, wherein the second semiconductor-metal compound structure contains n-type dopants;

forming a first conductive feature over the first semiconductor-metal compound structure; and forming a second conductive feature over the second semiconductor-metal compound structure.

14. The method for forming a semiconductor device structure as claimed in claim 10, further comprising:

epitaxially growing a silicon germanium cap on the photo-sensing epitaxial structure; and epitaxially growing a silicon cap on the silicon germanium cap, wherein the silicon cap is separated from the photo-sensing epitaxial structure by the silicon germanium cap.

15. A method for forming a semiconductor device structure, comprising:

forming a p-type doped structure and an n-type doped structure at least partially surrounded by a substrate;

partially removing the substrate to form a recess extending into the p-type doped structure and an n-type doped structure; and forming a photo-sensing structure over a bottom of the recess, wherein a portion of the photo-sensing structure is between the p-type doped structure and the n-type doped structure, the photo-sensing structure extends across a top and a bottom of the p-type doped structure, and the photo-sensing structure contains germanium and tin.

16. The method for forming a semiconductor device structure as claimed in claim 15, further comprising:

forming a buffer layer at least partially surrounded by the substrate before the photo-sensing structure is formed, wherein the buffer layer extends along a bottom and sidewalls of the photo-sensing structure.

17. The method for forming a semiconductor device structure as claimed in claim 15, further comprising:

epitaxially growing a first cap on the photo-sensing structure; and epitaxially growing a second cap on the first cap, wherein the second cap is separated from the photo-sensing structure by the first cap.

18. The method for forming a semiconductor device structure as claimed in claim 17, wherein the first cap has a higher atomic concentration of germanium than the second cap.

19. The method for forming a semiconductor device structure as claimed in claim 15, wherein the photo-sensing structure is formed closer to a bottom of the substrate than the p-type doped structure.

20. The method for forming a semiconductor device structure as claimed in claim 15, further comprising:

forming an isolation structure extending into the substrate; and forming a mask element covering the isolation structure, wherein the photo-sensing structure protrudes upward beyond a top of the mask element.

* * * * *